(12) United States Patent
So

(10) Patent No.: US 7,235,434 B2
(45) Date of Patent: Jun. 26, 2007

(54) THIN FILM TRANSISTOR WITH MULTIPLE GATES USING METAL INDUCED LATERAL CRYSTALLIZATION AND METHOD OF FABRICATING THE SAME

(75) Inventor: Woo-Young So, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 227 days.

(21) Appl. No.: 11/010,271

(22) Filed: Dec. 14, 2004

(65) Prior Publication Data

US 2005/0095753 A1    May 5, 2005

Related U.S. Application Data

(60) Continuation of application No. 10/890,999, filed on Jul. 15, 2004, now Pat. No. 7,001,802, which is a division of application No. 10/298,559, filed on Nov. 19, 2002, now Pat. No. 6,815,267.

(30) Foreign Application Priority Data

Dec. 19, 2001 (KR) ................. 2001-81446

(51) Int. Cl.
*H01L 21/00* (2006.01)
(52) U.S. Cl. .............. 438/150; 438/166; 438/149; 438/151; 257/E51.005; 257/E29.117
(58) Field of Classification Search .......... 438/149, 438/150, 151, 168, 166
See application file for complete search history.

(56) References Cited

U.S. PATENT DOCUMENTS 5,403,772 A   4/1995  Zhang et al. .......... 437/101
5,488,000 A   1/1996  Zhang et al.
5,534,716 A   7/1996  Takemura
5,604,360 A   2/1997  Zhang et al.
5,656,575 A   8/1997  Mueller
5,773,327 A   6/1998  Yamazaki et al. .......... 438/154

(Continued)

FOREIGN PATENT DOCUMENTS

CN    1198596 A    11/1998

(Continued)

OTHER PUBLICATIONS

U.S. Appl. No. 10/237,875, filed Sep. 10, 2002, Woo-Young So.

(Continued)

*Primary Examiner*—Thao P. Le
(74) *Attorney, Agent, or Firm*—Stein, McEwen & Bui, LLP

(57) ABSTRACT

A thin film transistor with multiple gates using an MILC process which is capable of materializing multiple gates without increasing dimensions and a method thereof. The thin film transistor has a semiconductor layer which is formed on a insulating substrate in a zigzag shape; and a gate electrode which is equipped with one or more slots intersecting with the semiconductor layer, the semiconductor layer includes two or more body parts intersecting with the gate electrode; and one or more connection parts connecting each neighboring body part, wherein a part overlapping the semiconductor layer in the gate electrode acts as a multiple gate, and MILC surfaces are formed at a part which does not intersect with the gate electrode in the semiconductor layer.

21 Claims, 16 Drawing Sheets

U.S. PATENT DOCUMENTS

| | | |
|---|---|---|
| 5,895,935 A | 4/1999 | Yamazaki et al. |
| 6,027,987 A | 2/2000 | Yamazaki et al. |
| 6,031,328 A | 2/2000 | Nakamoto |
| 6,034,748 A | 3/2000 | Furuta |
| 6,103,558 A | 8/2000 | Yamanaka et al. ........... 438/166 |
| 6,184,559 B1 | 2/2001 | Hayakawa et al. |
| 6,207,481 B1 | 3/2001 | Yi et al. ..................... 438/166 |
| 6,399,959 B1 | 6/2002 | Chang et al. ................. 257/57 |
| 6,475,835 B1 | 11/2002 | Hu et al. .................... 438/147 |
| 6,482,686 B1 | 11/2002 | Takemura |
| 6,596,572 B1 | 7/2003 | Kobori et al. |
| 6,596,573 B2 | 7/2003 | Lee et al. ................... 438/166 |
| 6,614,054 B1 | 9/2003 | Ahn |
| 6,703,289 B2 | 3/2004 | Muramatsu et al. |
| 6,706,573 B2 | 3/2004 | So |
| 6,815,267 B2 | 11/2004 | So |
| 6,861,300 B2 | 3/2005 | Ahn |
| 6,875,628 B1 * | 4/2005 | Zhang et al. ................. 438/30 |
| 6,903,370 B2 | 6/2005 | Voutsas et al. |
| 6,933,526 B2 | 8/2005 | So |
| 7,001,802 B2 | 2/2006 | So |
| 7,112,475 B2 | 9/2006 | So |
| 2001/0000011 A1 | 3/2001 | Zhang et al. |
| 2001/0000627 A1 | 5/2001 | Hayakawa et al. ......... 257/347 |
| 2001/0018240 A1 | 8/2001 | Joo et al. .................... 438/166 |
| 2001/0034088 A1 | 10/2001 | Nakamura et al. .......... 438/166 |
| 2001/0045559 A1 | 11/2001 | Yamazaki et al. ............ 257/66 |
| 2002/0074548 A1 | 6/2002 | Lee et al. |
| 2002/0137267 A1 | 9/2002 | Joo et al. .................... 438/166 |
| 2002/0146869 A1 | 10/2002 | So ............................. 438/149 |
| 2003/0111691 A1 | 6/2003 | So ............................. 257/347 |
| 2006/0003503 A1 | 1/2006 | Yang et al. |

FOREIGN PATENT DOCUMENTS

| | | |
|---|---|---|
| CN | 1053292 C | 6/2000 |
| EP | 1 052 700 A1 | 11/2000 |
| EP | 1 054 452 A2 | 11/2000 |
| JP | 6-244205 | 9/1994 |
| JP | 7-38118 | 2/1995 |
| JP | 7-153689 | 6/1995 |
| JP | 8-330595 | 12/1996 |
| JP | 9-293879 | 11/1997 |
| JP | 10-135137 | 5/1998 |
| JP | 10-154816 | 6/1998 |
| JP | 10-284734 | 10/1998 |
| JP | 2001-007335 | 1/2001 |
| JP | 2001-144027 | 5/2001 |

OTHER PUBLICATIONS

European Search Report, dated Oct. 26, 2004.
U.S. Appl. No. 10/978,376, filed Nov. 2, 2004, So.
U.S. Appl. No. 11/011,584, filed Dec. 15, 2004, So.
U.S. Appl. No. 11/023,637, filed Dec. 29, 2004, So.
U.S. Appl. No. 11/023,640, filed Dec. 29, 2004, So.
U.S. Appl. No. 11/105,382, filed Apr. 14, 2005, So

* cited by examiner

THIN FILM TRANSISTOR WITH MULTIPLE GATES USING METAL INDUCED LATERAL CRYSTALLIZATION AND METHOD OF FABRICATING THE SAME

This application is a continuation of application Ser. No. 10/890,999, filed on Jul. 15, 2004, which is now U.S. Pat. No. 7,001,802, which is divisional application of Ser. No. 10/298,559, filed on Nov. 19, 2002, now U.S. Pat. No. 6,815,267.

BACKGROUND OF THE INVENTION

1. Field of the Invention

The present invention relates to a thin film transistor using metal induced lateral crystallization (hereinafter referred to as "MILC") and a method of fabricating the same, and more particularly, to a TFT with multiple gates which prevents defects by removing MILC surfaces in a channel region and reduces leakage current by materializing multiple gates without increasing the area, and a method of fabricating the same.

2. Description of Related Art

A polysilicon film which is used as a semiconductor layer of a TFT is formed by crystallizing the deposited amorphous silicon film after depositing an amorphous silicon film on a substrate. Methods of crystallizing the amorphous silicon film into a polysilicon film include solid phase crystallization (SPC), eximer laser annealing (ELA), metal induced lateral crystallization (MILC), etc. The SPC process has problems of a high crystallization temperature and a long period of process time while the ELA process has problems of time and space non-uniformities due to instability of a laser. Although the MILC process has merits of a relatively low process temperature and short process time using ordinary heat treatment equipment, it has problems in that a leakage current of a device fabricated by the MILC process is larger than that of a device fabricated by other crystallization methods.

A method of fabricating a TFT using the MILC process is disclosed in U.S. Pat. No. 5,773,327. The method of fabricating a TFT suggested in U.S. Pat. No. 5,773,327 requires an additional mask process to form an MILC region, and the existence of MILC surfaces in the channel region act as defects of the TFT. The MILC surface refers to a portion in which two surfaces of crystallized polysilicon grown in an opposite direction by the MILC technique meet.

On the other hand, there are problems in that a crystallization time is increased since dimensions by multiple gates are increased, and dimensions separated between metal layers of the MILC are increased in the case that multiple gates are applied to control leakage current.

SUMMARY OF THE INVENTION

Accordingly, it is an object of the present invention to provide a TFT which is capable of realizing multiple gates without increasing dimensions thereof, and a method of fabricating the same.

It is another object of the present invention to provide a TFT with multiple gates which are capable of reducing leakage current, and a method of fabricating the same.

It is another object of the present invention to provide a TFT with multiple gates using each of separated multi-channel layers, and a method of fabricating the same.

It is another object of the present invention to provide a TFT with multiple gates using an MILC process in which the MILC surface exists outside a channel layer, and a method of fabricating the same.

It is another object of the present invention to provide a method of fabricating a TFT with multiple gates using an MILC process which is capable of reducing the masking process.

Additional objects and advantages of the invention will be set forth in part in the description which follows and, in part, will be obvious from the description, or may be learned by practice of the invention.

The foregoing and other objects of the present invention may be achieved by providing a thin film transistor using an MILC process comprising: a semiconductor layer which is formed on a insulating substrate in a zigzag shape; and a gate electrode which is formed so that it intersects with the semiconductor layer, wherein the semiconductor layer has an MILC surface at a part which is not crossed by the gate electrode.

The semiconductor layer comprises: two or more body parts intersecting with the gate electrode; and one or more connection parts to connect each neighboring body part, and wherein a part intersecting with the gate electrode in the semiconductor layer acts as a channel region.

The gate electrode is equipped with one or more slots intersecting the semiconductor layer, wherein a part overlapped with the channel region of the semiconductor layer acts as a multiple gate.

The foregoing and other objects of the present invention may also be achieved by providing a thin film transistor using an MILC process comprising: multi-semiconductor layers each of which is adjacently formed on a insulating substrate; and a gate electrode equipped with one or more slots intersecting with the multi-semiconductor layers, wherein MILC surfaces do not exist in the multi-semiconductor layers.

The foregoing and other objects of the present invention may also be achieved by providing a method of fabricating a thin film transistor with multiple gates using an MILC process comprising: forming an amorphous silicon film in a zigzag shape on a insulating substrate; forming a gate insulating film on the front surface of the substrate; forming a gate electrode on a gate insulating film so that the gate electrode intersects with an amorphous silicon film; forming on the front surface of the substrate an interlayer insulating film equipped with contact holes exposing edges of each of two sides of the amorphous silicon film; forming a metal layer contacting the exposed part of the amorphous silicon film through the contact holes; forming a semiconductor layer comprising a polycrystalline silicon film by crystallizing the amorphous silicon film using the MILC process; and forming source/drain electrodes contacting the semiconductor layers through the contact holes.

The foregoing and other objects of the present invention may also be achieved by providing a method of fabricating a thin film transistor with multiple gates using an MILC process comprising: forming a multi-semiconductor layer having neighboring polycrstalline silicon films using the MILC process on an insulating substrate; forming a gate electrode equipped with one or more slots intersecting with the multi-semiconductor layer; forming contact holes so that each of two edges of the multi-semiconductor layer are exposed; simultaneously forming source/drain electrodes contacting one exposed side edge of the multi-semiconductor layer, and forming a link to connect the other exposed side edge of the multi-semiconductor layer with a multi-semiconductor layer to be contacted.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1A:
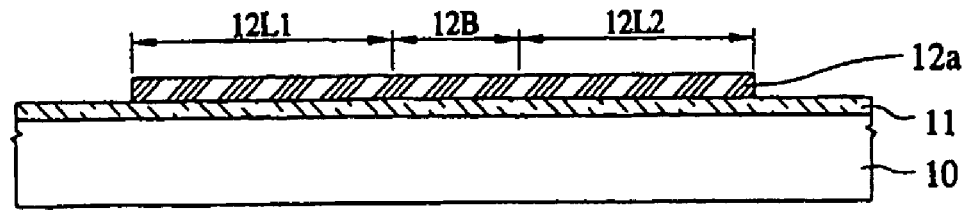
FIG. 1A to FIG. 1D are sectional views illustrating a method of fabricating a multi-gate TFT using an MILC process according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 1B:
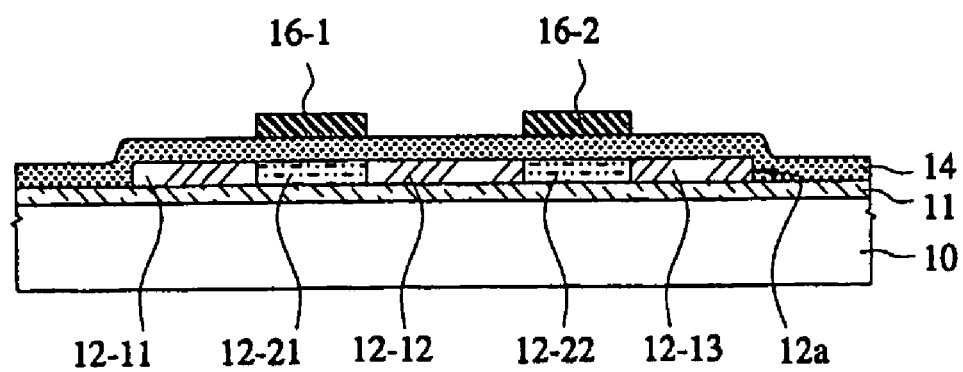
Figure 1C:
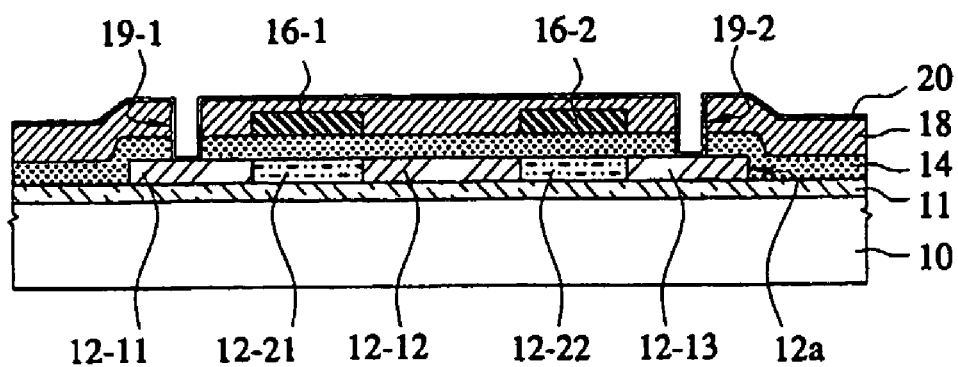
Figure 1D:
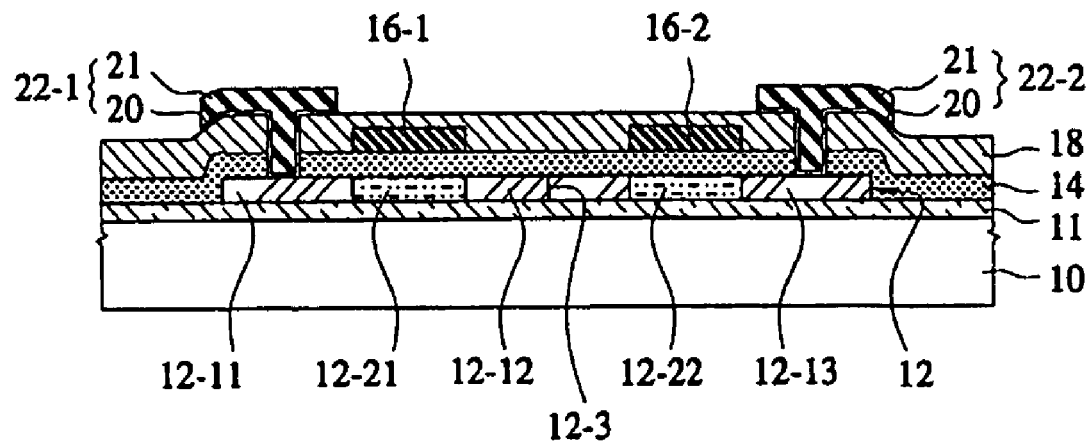
Figure 2A:
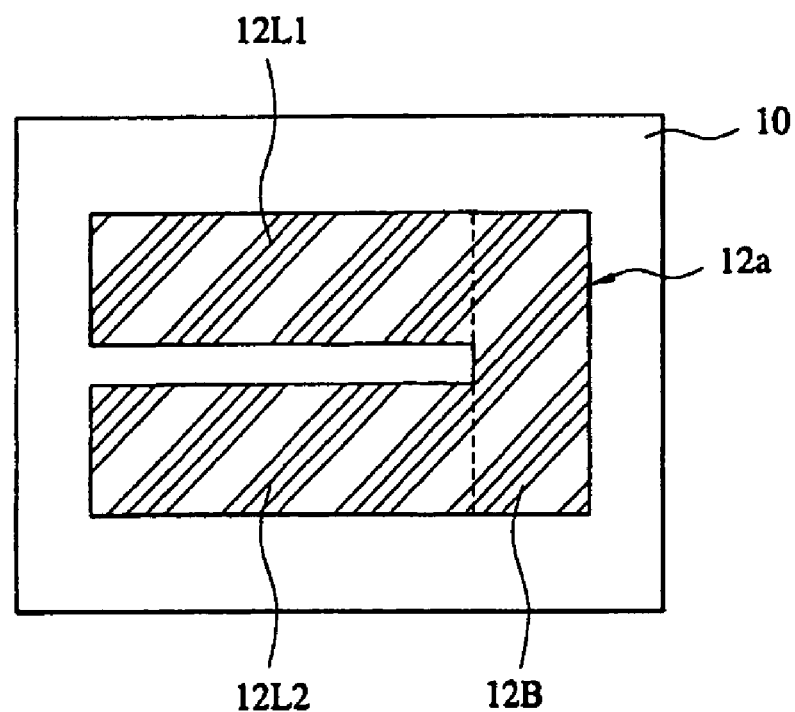
FIG. 2A to FIG. 2D are plan views illustrating a method of fabricating a multi-gate TFT using the MILC process according to the embodiment of FIGS. 1A to 1D.
Figure 2B:
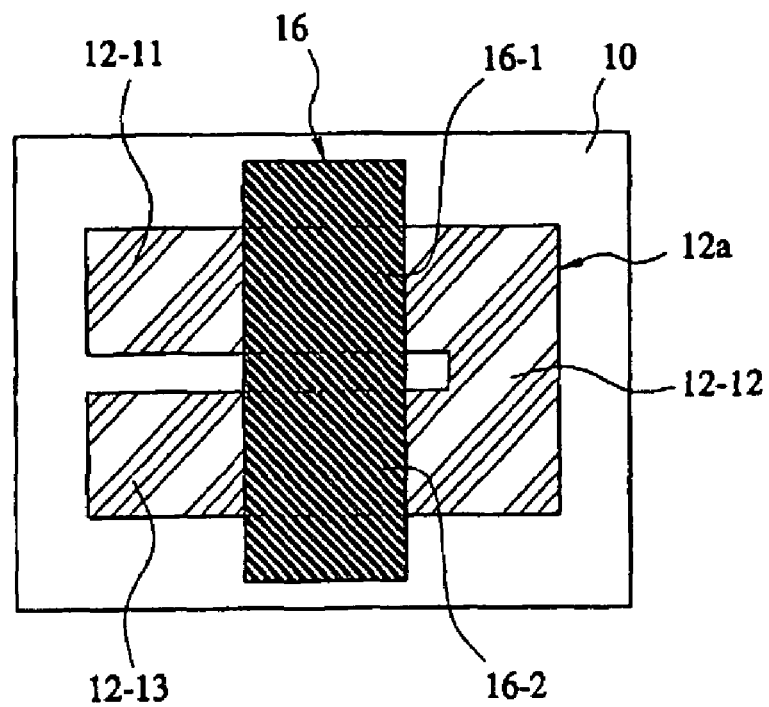
Figure 2C:
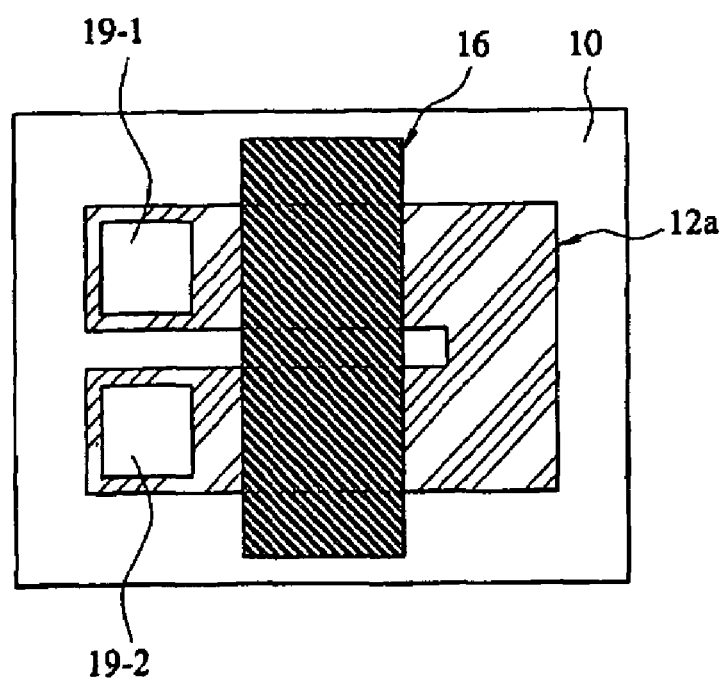
Figure 2D:
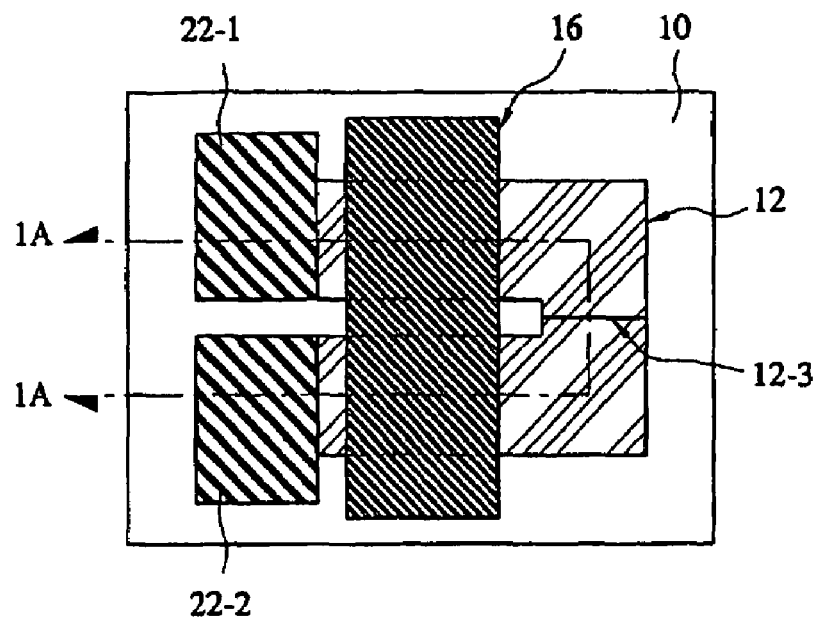

FIG. 1A to FIG. 1D are sectional views illustrating a method of fabricating a multi-gate TFT using an MILC process according to an embodiment of the present invention, and FIG. 2A to FIG. 2D are plan views illustrating a method of fabricating a multi-gate TFT using the MILC process according to the embodiment of FIG. 1A to FIG. 1D, wherein FIG. 1A to FIG. 1D are the cross-sectional structures illustrating a fabrication method according to a line 1A–1A' of FIG. 2D.

Referring to FIG. 1A and FIG. 2A, a buffer layer 11 is formed on a insulating substrate 10 such as a glass substrate, and an amorphous silicon film is patterned using a first mask (which is not shown in the drawings) after depositing an amorphous silicon film on the buffer layer 11 so that a semiconductor layer 12a having an amorphous silicon film is formed, wherein the semiconductor layer 12a comprising an amorphous silicon film has a "⊏" shaped structure equipped with body parts 12L1 and 12L2 and a connection part 12B connecting the body parts 12L1 and 12L2.

Although several embodiments of the present invention exemplify that the semiconductor layer 12a has a "⊏" shaped structure equipped with a pair of body parts 12L1 and 12L2 and a connection part 12B connecting the body parts 12L1 and 12L2, the semiconductor layer 12a is not necessarily limited to such a structure, but can have a "E" or "ᗱ" shaped structure, or a combination thereof equipped with a plurality of body parts 12L, wherein each of the plurality of body parts 12L are connected by a plurality of connection parts 12B so that the semiconductor layer 12a has a zigzag shaped structure.

Referring to FIG. 1B and FIG. 2B, a gate electrode material is deposited on the gate insulating film 14 after forming a gate insulating film 14 on a buffer layer 11 comprising the semiconductor layer 12a. A gate electrode 16 is formed by patterning the gate electrode material using a second mask (which is not shown on the drawings).

The gate electrode 16 is formed so that it intersects with the body parts 12L1 and 12L2 of the semiconductor layer 12a, wherein a part 16-1 of the gate electrode 16 overlapping a first body part 12L1 acts as a first gate while a part 16-2 overlapping a second body 12L2 acts as a second gate, thereby obtaining a multi-gate.

On the other hand, the gate electrode 16 has a structure of multiple gates since parts overlapping each of the body parts 12L act as a gate where the semiconductor layer 12a is not formed in a "⊏" shape, but formed in a zigzag shape equipped with a plurality of body parts 12L.

Impurity areas 12-11~12-13 for source/drain regions are formed by ion-implanting impurities, for example, N-type or P-type impurities into the semiconductor layer 12a comprising an amorphous silicon film after forming the gate electrode 16.

A part of the lower part of the first gate 16-1 in the semiconductor layer 12a comprises an amorphous silicon film, namely, a part between impurity areas 12-11 and 12-12 for source/drain regions acts as a first channel region 12-21, and a part of the lower part of the second gate 16-2, namely, a part between impurity areas 12-12 and 12-13 for the source/drain regions acts as a second channel region 12-22.

Referring to FIG. 1C and FIG. 2C, an interlayer insulating film 18 is formed on the gate insulating film 14 comprising the gate electrode 16, and contact holes 19-1 and 19-2 are respectively formed in impurity areas 12-11 and 12-13 for the source/drain regions by etching the interlayer insulating film 18 and the gate insulating film 14 using a third mask (which is not shown on the drawings). The contact holes 19-1 and 19-2 are formed at edge parts of both sides of a zigzag shaped semiconductor layer 12a so that the contact holes 19-1 and 19-2 are formed at one side edge of the body part arranged at the outermost wall part in a plurality of body parts 12L1 and 12L2, that is, one side edge of the body part that is not connected by a connection part 12B.

Subsequently, a metal film 20 which is capable of forming a metal silicide such as Ni and Pd on the front surface of a substrate is formed to a thickness of several to hundreds of angstroms Å, wherein the metal film 20 is formed so that the metal film 20 directly contacts exposed impurity areas 12-11 and 12-13 in the semiconductor layer 12a comprising an amorphous silicon film through the contact holes 19-1 and 9-2. The metal film 20 acts as a catalyst layer during succeeding MILC processes, and a process in which a metal film 20 is patterned using a separate mask is excluded in the present embodiment since the metal film 20 is formed on the interlayer insulating film 18 so that the metal film 20 contacts the amorphous silicon film of the semiconductor layer 12a only through the contact holes 19-1 and 19-2.

Referring to FIG. 1D and FIG. 2D, a semiconductor layer 12 comprises a polycrystalline silicon film formed by crystallizing an amorphous silicon film 12a using an MILC process, wherein an MILC surface 12-3 does not exist in first and second channel regions 12-21 and 12-22 of the semiconductor layer 12, but exists in an impurity area 12-12 for the source/drain regions. The MILC surface is a portion in which two surfaces of crystallized polysilicon grown in an opposite direction by the MILC technique meet.

Subsequently, source/drain electrodes 22-1 and 22-2 are formed by patterning the metal for the source/drain electrodes 21 and the metal film 20 at the lower part thereof using a fourth mask (which is not shown on the drawings) after depositing metal for source/drain electrodes 21 on the metal film 20.

In the present embodiment, the metal film 20 for the MILC process is not removed, but is used as the source/drain electrodes 22-1 and 22-2. However, the metal film 20 for the MILC can be removed after progressing the MILC process.

Figure 3A:
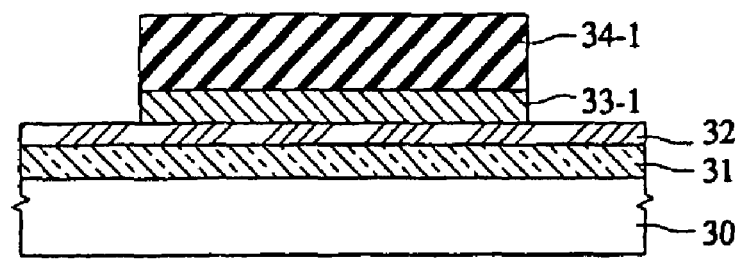
FIG. 3A to FIG. 3F are sectional views illustrating a method of fabricating a multi-gate TFT using an MILC process according to another embodiment of the present invention.
Figure 3B:
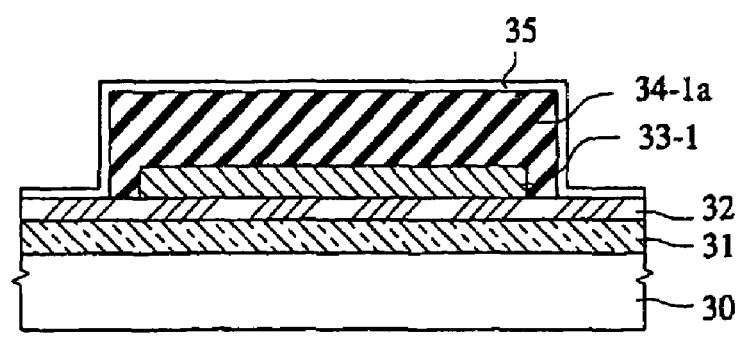
Figure 3C:
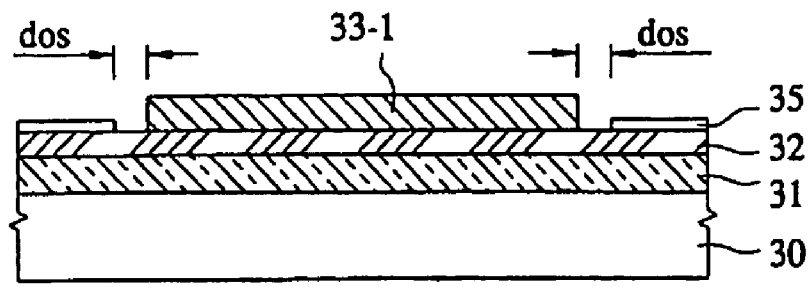
Figure 3D:
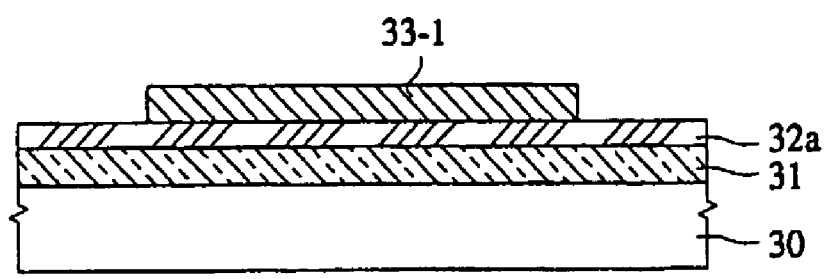
Figure 3E:
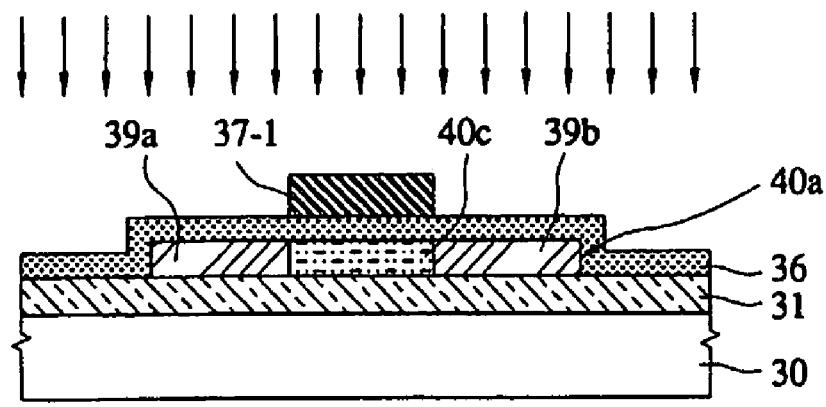
Figure 3F:
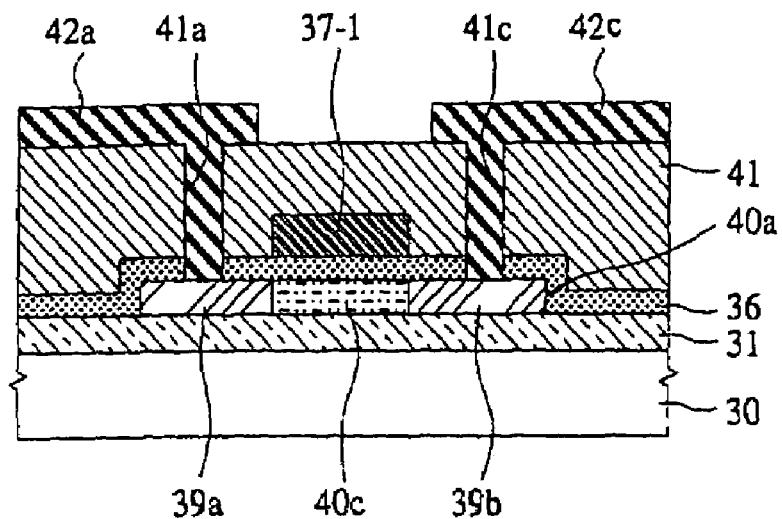
Figure 4A:
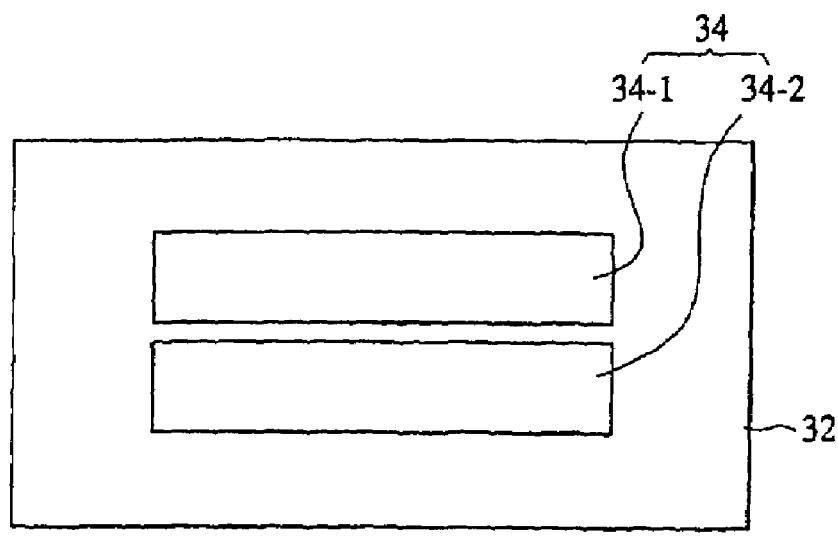
FIG. 4A to FIG. 4F are plan views illustrating a method of fabricating a multi-gate TFT using the MILC process according the embodiment of FIGS. 3A to 3D.
Figure 4B:
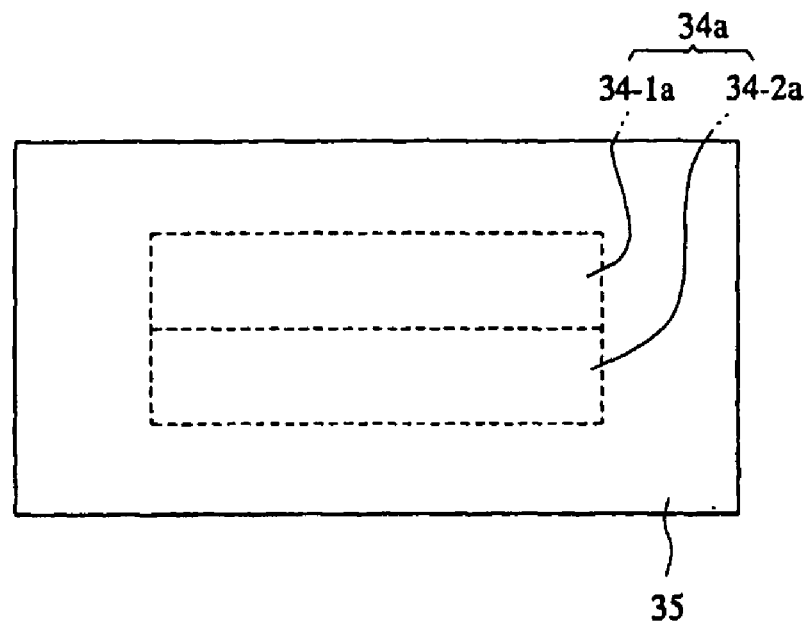
Figure 4C:
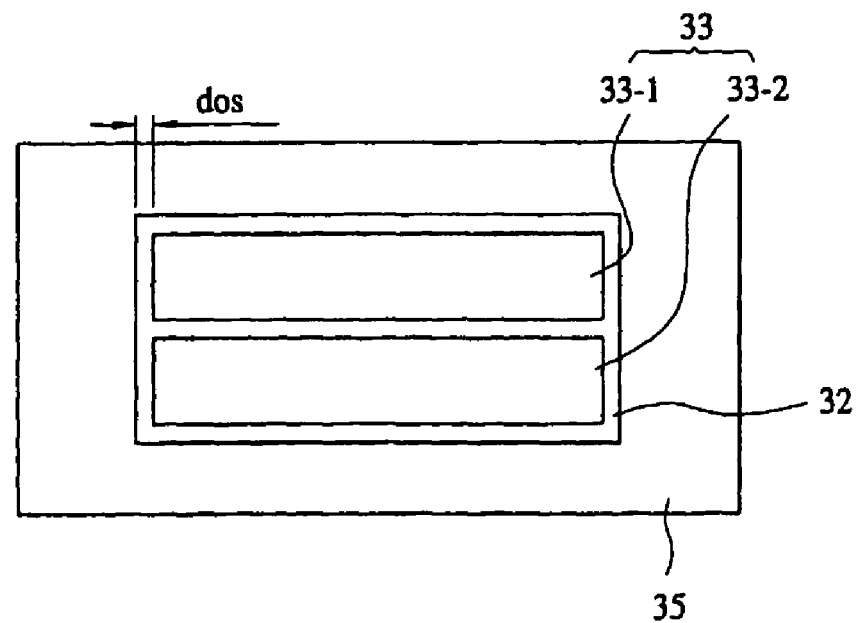
Figure 4D:
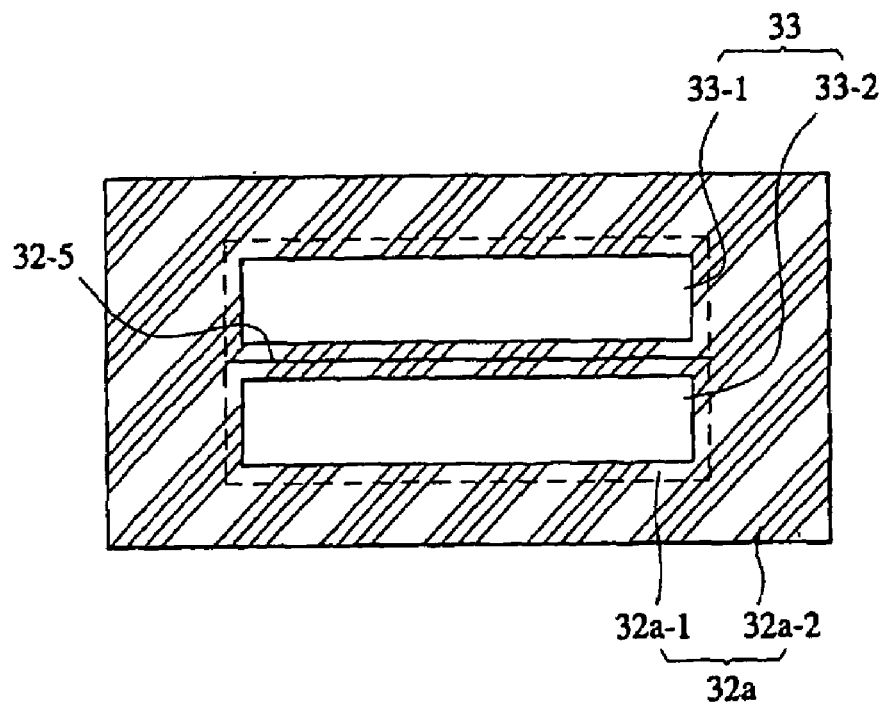
Figure 4E:
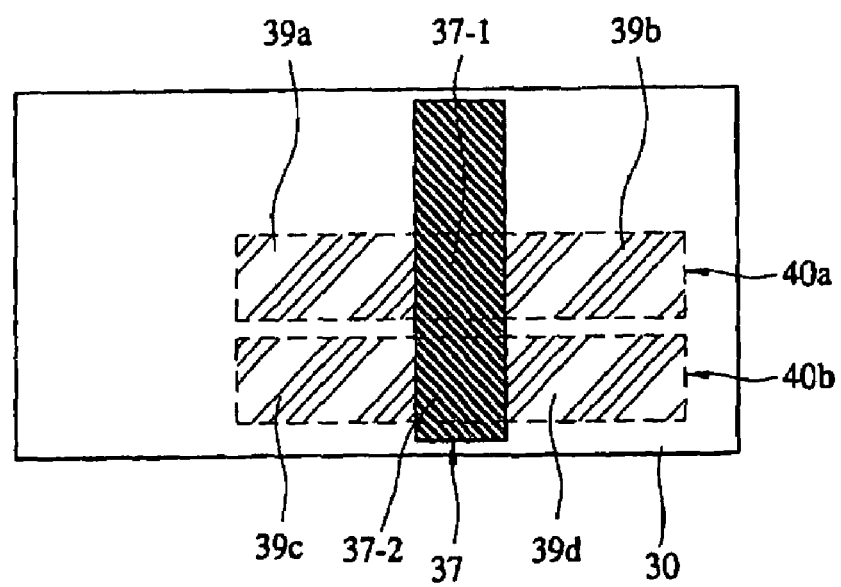
Figure 4F:
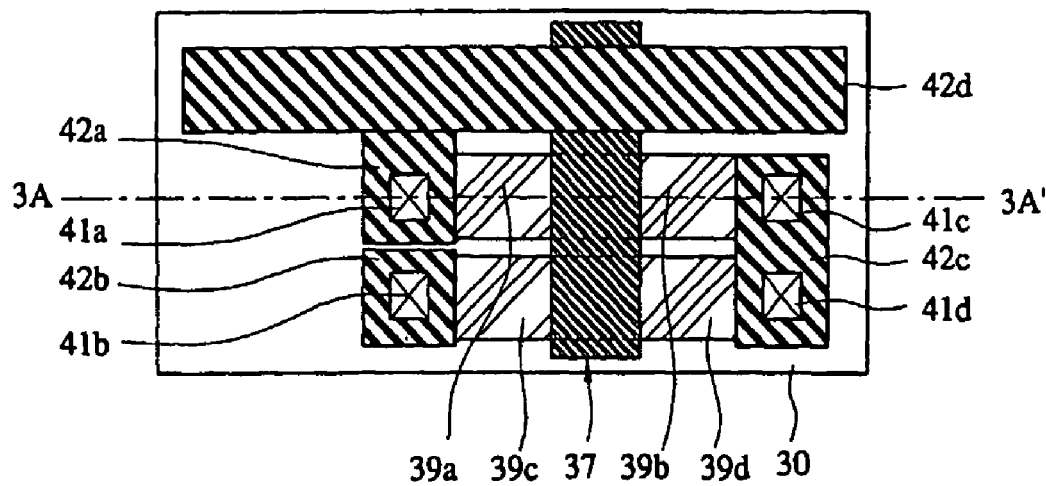

FIG. 3A to FIG. 3F illustrate process sectional views illustrating a method of fabricating a multiple gate TFT with a multi-semiconductor layer using an MILC process according to another embodiment of the present invention, and FIG. 4A to FIG. 4F illustrate plan views illustrating a method of fabricating a multiple gate TFT with a multi-semiconductor layer using the MILC process according to the embodiment of FIG. 3A to FIG. 3F, wherein FIG. 3A to FIG. 3F illustrate the cross-sectional structure according to a line 3A–3A' of FIG. 4F limited to a first semiconductor layer in the multi-semiconductor layer, and a second semiconductor layer has the same structure as the first semiconductor layer.

A method of fabricating a thin film transistor using an MILC process according to the embodiment of FIGS. 3A–3F uses a fabrication method disclosed in Korean Patent Application No. 2001-18010.

Referring to FIG. 3A and FIG. 4A, a buffer layer 31 comprising an oxidation film is formed on an insulating substrate 30 such as a glass substrate, and an amorphous silicon film 32 and an oxidation film as a blocking layer 33 are subsequently formed on a buffer layer 31.

A photosensitive film 34 having the same pattern as a mask to form a multi-semiconductor layer formed in the subsequent process is formed on the blocking layer 33 using a first mask (which is not shown on the drawings), wherein the photosensitive film 34 has a first pattern 34-1 for a first semiconductor layer and a second pattern 34-2 for a second semiconductor layer which are spaced apart from each other by a predetermined distance.

A first pattern 33-1 functioning as a blocking layer for the first semiconductor layer and a second pattern 33-2 functioning as a blocking layer for the second semiconductor layer are formed by patterning the blocking layer 33 at the lower part of the photosensitive film 34 using the photosensitive film 34.

Referring to FIG. 3B and FIG. 4B, when the photosensitive film 34 is applied so as to completely cover the patterned blocking layer 33, a first pattern 34-1a and a second pattern 34-2a of a photosensitive film 34a contact each other, and the blocking layer 33 and an amorphous silicon film 32 between the first pattern 34-1a and the second pattern 34-2a are completely covered by the photosensitive film 34a. Subsequently, a metal film 35, which is capable of forming metal silicide such as Ni or Pd, is formed over the front surface of the substrate in a thickness of several to hundreds of angstroms Å.

Referring to FIG. 3C and FIG. 4C, the blocking layer 33 is exposed by removing the photosensitive film 34a, wherein a part exposed upon removal of the photosensitive film 34a in the amorphous silicon film 32 acts as an MILC offset region (dos).

Referring to FIG. 3D and FIG. 4D, a polycrystalline silicon film 32a is formed by crystallizing the amorphous silicon film 32 using the MILC process, and then the remaining metal film 35 is removed, wherein the polycrystalline silicon film 32a is divided into a part crystallized by the MILC portion 32a-2 and a part crystallized by the MILC 32a-1 portion, and an MILC surface 32-5 is also exposed by existing between a first pattern 33-1 and a second pattern 33-2 of the neighboring blocking layer 33.

Referring to FIG. 3E and FIG. 4E, a multi-semiconductor layer comprising a first semiconductor layer 40a and a second semiconductor layer 40b including only a part crystallized by the MILC process is formed by etching the polycrystalline silicon film 32a at the lower part of the blocking layer 33 using the first pattern 33-1 and the second pattern 33-2 of the blocking layer 33 as a mask, wherein the exposed MILC surface 32-5 is removed and does not exist in the first and second semiconductor layers 40a and 40b when forming the first semiconductor layer 40a and the second semiconductor layer 40b using the blocking layer 33 as a mask.

Subsequently, a gate insulating film 36 is formed on the front surface of a substrate after removing the blocking layer 33, and a gate electrode 37 is formed on the gate insulating film 36 using a second mask (which is not shown in the drawings) to form a gate, wherein a part overlapped by the first semiconductor layer 40a acts as a first gate 37-1, and a part overlapped by the second semiconductor layer 40b acts as a second gate 37-2 in the gate electrode 37.

Each of impurity areas 39a~39d for source/drain regions are formed by ion-implanting high concentrated impurities of P-type or N-type into the first semiconductor layer 40a and the second semiconductor layer 40b using the gate electrode 37 as a mask, wherein a part overlapped by the first gate 37-1 in the first semiconductor layer 40a acts as a first channel region while a part overlapped by the second gate 37-2 in the second semiconductor layer 40b acts as a second channel region.

Referring to FIG. 3F and FIG. 4F, an interlayer insulating film 41 is formed on the front surface of the substrate, and contacts 41a and 41b for the source/drain electrodes 42a and 42b and linking contacts 41c and 41d to connect first and second semiconductor layers 40a and 40b, that is, impurity areas 39b and 39d for source/drain regions are formed by etching the interlayer insulating film 41 and the gate insulating film 36 so that the impurity areas 39a through 39d are exposed using a third mask (which is not shown in the drawings) to form contacts.

Source/drain electrodes 42a and 42b connected with impurity areas 39a and 39c for the source/drain regions through contacts 41a and 41b, a link 42c, and a data line 42d to connect impurity areas 39b and 39d for the source/drain regions through linking contacts 41c and 41d are formed by patterning the deposited electrode material using a fourth mask (which is not shown in the drawings) to form the source/drain electrodes after depositing a source/drain electrode material on the interlayer insulating film 41.

Figure 10:
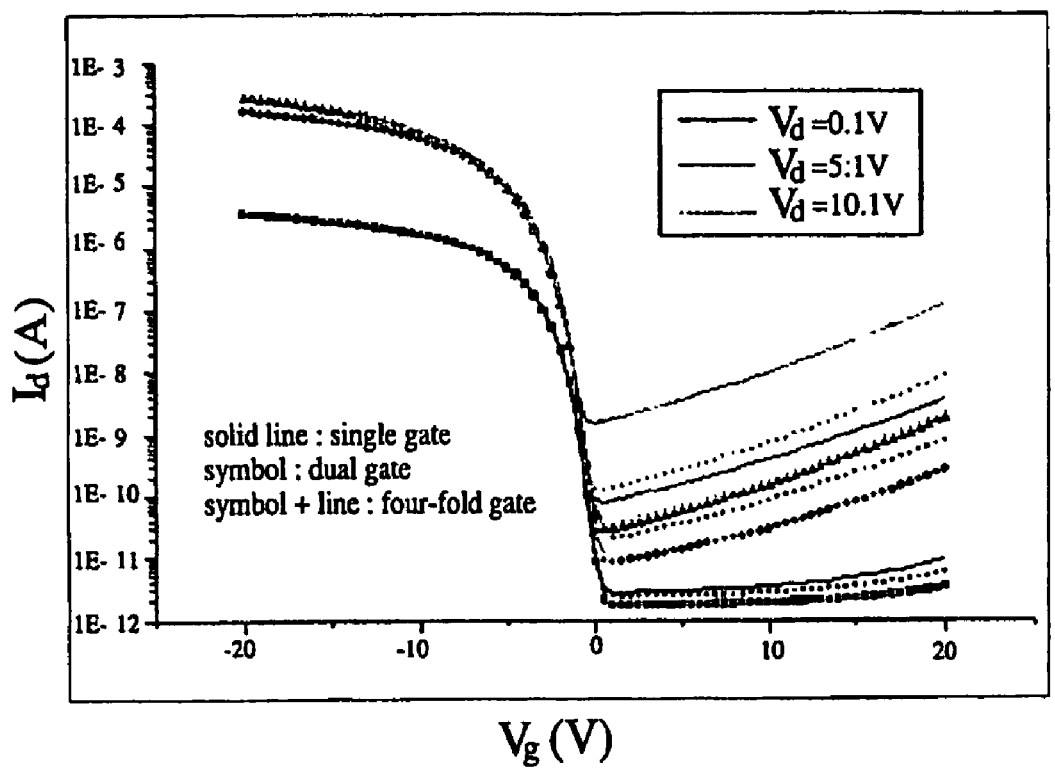
FIG. 10 is a drawing illustrating leakage current characteristics in a TFT with multiple gates according to the embodiments of the present invention.

The method of fabricating a thin film transistor according to this embodiment enables fabricating of a multi-gate thin film transistor using the MILC technique without an additional masking process, thereby not only simplifying the processes involved, but also suppressing leaking of current as illustrated in FIG. 10 by removing the MILC surface containing a large amount of metal during the etching process to form a multi-semiconductor layer, thus removing the causes of defects.

Furthermore, although it is illustrated in this embodiment that the gate has an "I" shaped structure, it is also possible that the gate can be formed as a structure having a plurality of slots as described in the following examples. In this case, a thin film transistor not having a multi-gate structure of a multi-semiconductor layer but having a structure of 2×N (slot numbers of the gate electrode+1) multi-channel layers or multiple gates is supplied instead.

Figure 5A:
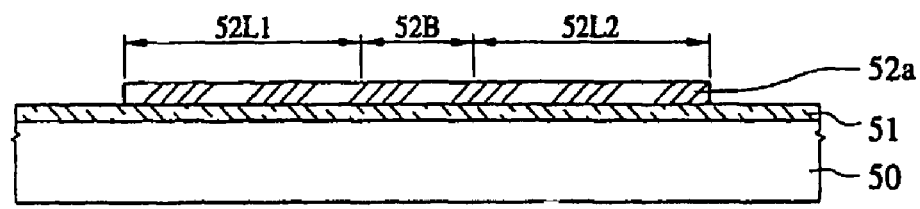
FIG. 5A to FIG. 5D are process sectional views illustrating a method of fabricating a 4-fold gate TFT using the MILC process according to yet another embodiment of the present invention.
Figure 5B:
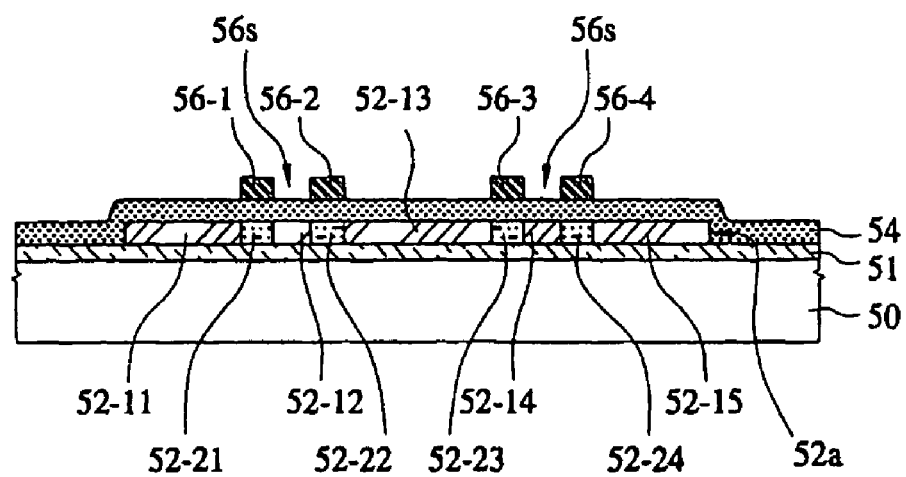
Figure 5C:
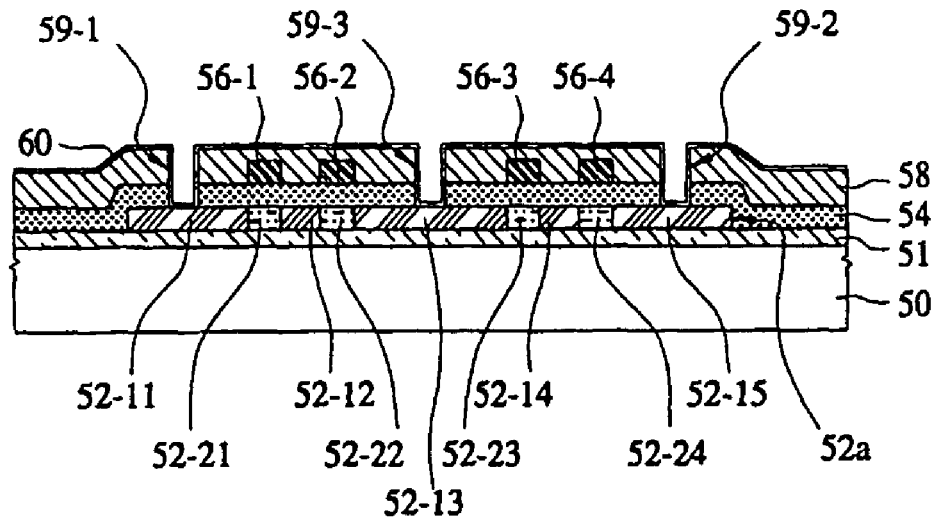
Figure 5D:
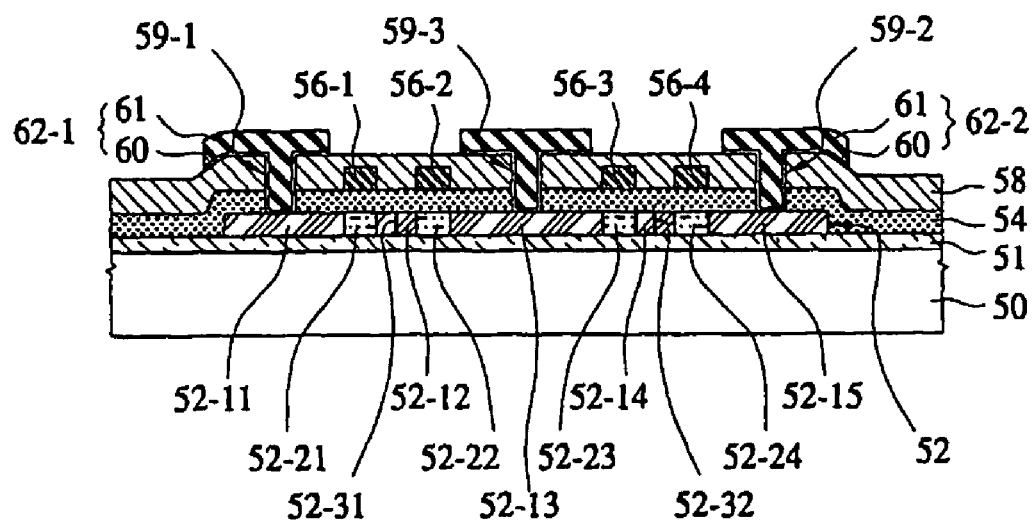
Figure 6A:
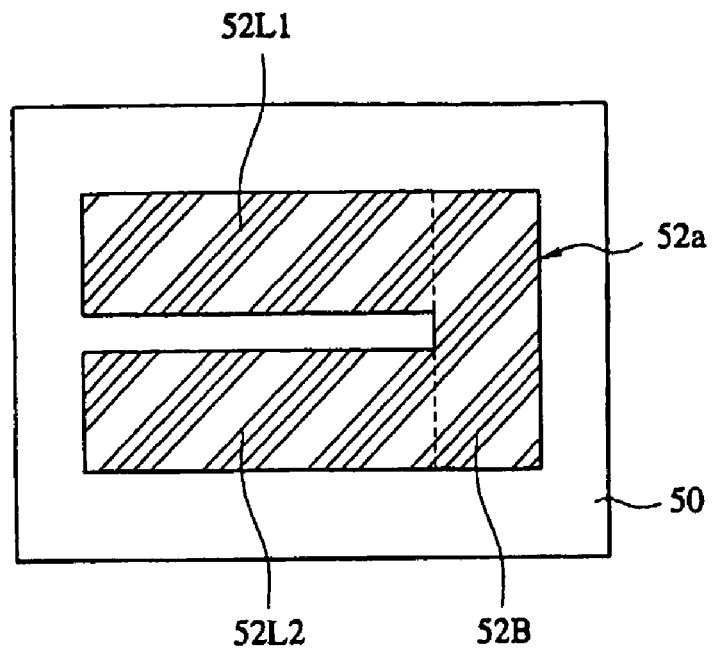
FIG. 6A to FIG. 6D are plan views illustrating a method of fabricating a 4-fold gate TFT using the MILC process according to the embodiment of FIGS. 5A to 5D.
Figure 6B:
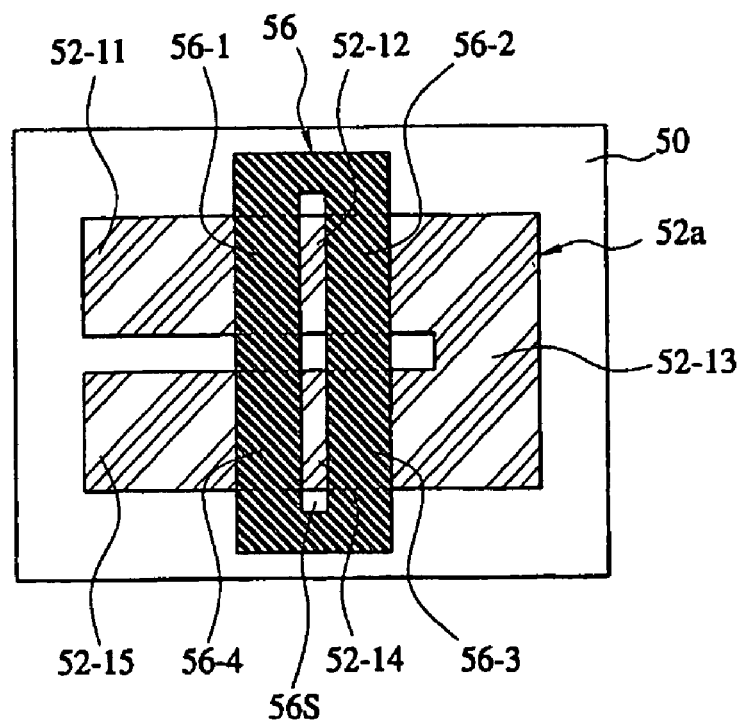
Figure 6C:
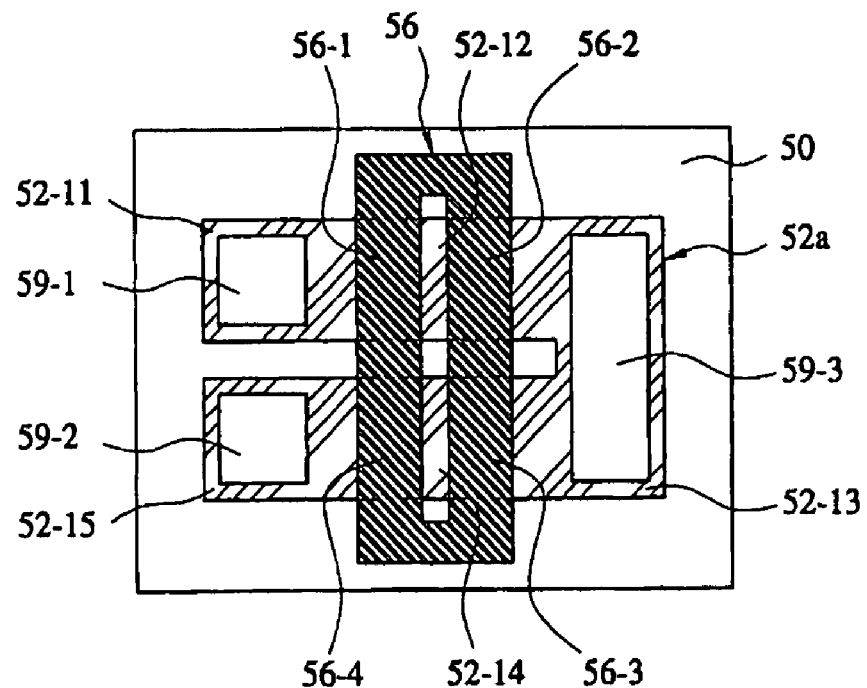
Figure 6D:
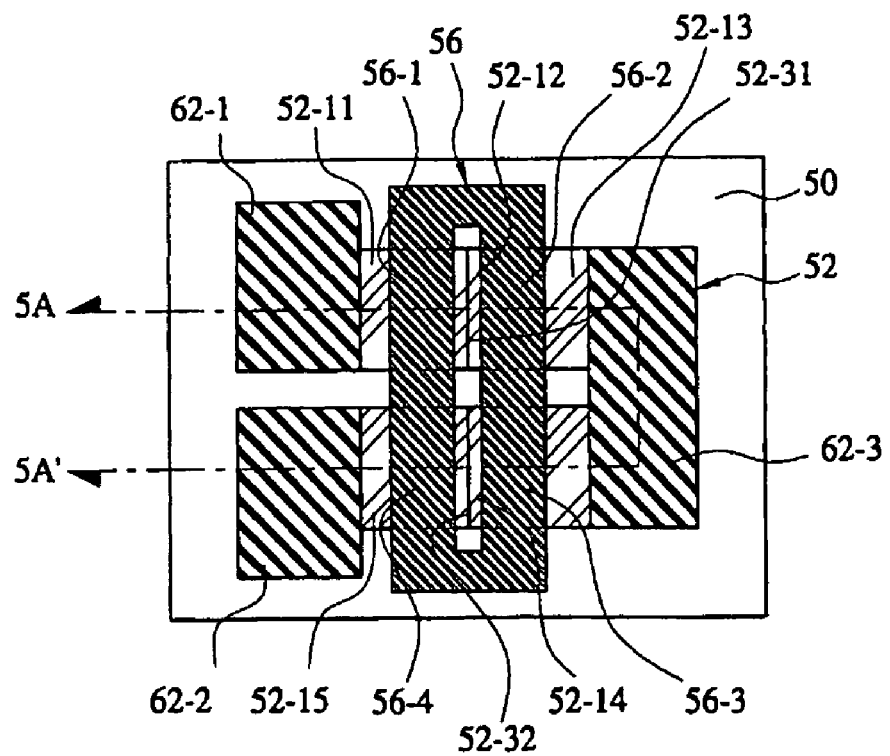

FIG. 5A to FIG. 5D are sectional views illustrating a method of fabricating a TFT with 4-fold gates using an MILC process according to another embodiment of the present invention, and FIG. 6A to FIG. 6D illustrate plan views of a method of fabricating a TFT with 4-fold gates using the MILC process according to the embodiment of FIGS. 5A to 5D, wherein the process sectional views of FIG. 5A to FIG. 5D illustrate the cross-sectional structure according to line 5A–5A' of FIG. 6D.

Referring to FIG. 5A and FIG. 6A, a buffer layer 51 is formed on an insulating substrate 50 such as a glass substrate, and an amorphous silicon film is deposited on the buffer layer 51. A semiconductor layer 52a comprising an amorphous silicon film is formed by patterning the amorphous silicon film using a first mask (which is not shown in the drawings). The semiconductor layer 52a comprising an amorphous silicon film has a "⊏" shaped structure equipped with body parts 52L1 and 52L2 and a connection part 52B to connect the body parts 52L1 and 52L2.

Although a "⊏" shaped structure is illustrated in the drawings in which the semiconductor layer 52a is equipped with a pair of body parts 52L1 and 52L2 and a connection part 52B to connect the body parts 52L1 and 52L2, the semiconductor layer 52a is not limited to the body parts 52L1 and 52L2 and the connection part 52B, but can be equipped with a plurality of body parts 52L, wherein the plurality of body parts 52L are connected by a plurality of connection parts 52B respectively so that the semiconductor layer 52a has a zigzag shaped structure.

Referring to FIG. 5B and FIG. 6B, a gate electrode material is deposited on a gate insulating film 54 after forming a gate insulating film 54 on a buffer layer 51 including the semiconductor layer 52a comprising an amorphous silicon film. A gate electrode 56 is formed by patterning the gate electrode material using a second mask (which is not shown in the drawings).

The gate electrode 56 is formed so that it intersects with body parts 52L1 and 52L2 of the semiconductor layer 52a, wherein the gate electrode 56 is equipped with one slot 56S crossing the body parts 52L1 and 52L2, thus equipped with 4-fold gates. That is, in the gate electrode 56, parts 56-1 and 56-2 overlapping a first body part 52L1 out of the body parts 52L1 and 52L2 act as first and second gates, and parts 56-3 and 56-4 overlapping a second body part 52L2 out of the body parts 52L1 and 52L2 act as third and fourth gates.

Impurity areas 52-11 through 52-15 for source/drain regions are formed by ion-planting impurities, for example, N-type or P-type impurities into a semiconductor layer 52a comprising an amorphous silicon film after forming the gate electrode 56.

In the semiconductor layer 52a comprising an amorphous silicon film, a part of the lower part of the first gate 56-1, namely, a part between impurity areas 52-11 and 52-12 for source/drain regions acts as a first channel region 52-21, and a part of the lower part of the second gate 56-2, namely, a part between impurity areas 52-12 and 52-13 for source/drain regions acts as a second channel region 52-22.

Furthermore, in the semiconductor layer 52a comprising an amorphous silicon film, a part of the lower part of the third gate 56-3, namely, a part between impurity areas 52-13 and 52-14 for source/drain regions acts as a third channel region 52-23, and a part of the lower part of the fourth gate 564, namely, a part between impurity areas 52-14 and 52-15 for source/drain regions acts as a fourth channel region 52-24.

On the other hand, the gate electrode 16 may act as a multiple gate structure where a part overlapping each of the body parts 52L acts as a gate when the semiconductor layer 52a has a zigzag shape equipped with a plurality of body parts 52L.

Referring to FIG. 5C and FIG. 6C, an interlayer insulating film 58 is formed on a gate insulating film 54 comprising the gate electrode 56, and contact holes 59-1 through 59-3 are formed so that the impurity areas 52-11, 52-13 and 52-15 for source/drain regions are exposed by etching the interlayer insulating film 58 and the gate insulating film 54 using a third mask (which is not shown in the drawings).

Subsequently, a metal film 60 which is capable of forming a metal silicide such as Ni and Pd is formed on the front surface of a substrate in a thickness of several to hundreds of angstroms Å. The metal film 60 is formed so that it directly contacts the impurity areas 52-11 and 52-15 exposed through first and second contact holes 59-1 and 59-2 and directly contacts the impurity area 52-13 exposed through a third contact hole 59-3, wherein an additional masking process to pattern the metal film for the MILC catalyst layer, as required in the conventional method, is not required since the metal film 60 functions as a catalyst layer during the succeeding MILC process and is formed on the interlayer insulating film 58 so that the metal film 60 contacts the amorphous silicon film 52a only through the contact holes 59-1 through 59-3.

Referring to FIG. 5D and FIG. 6D, a semiconductor layer 52 comprising a polycrystalline silicon film is formed by crystallizing an amorphous silicon film 52a using the MILC process. A crystallization time is further shortened since crystallization is simultaneously progressed at both sides of the body parts differently than in the embodiment of FIGS. 1A to 1D during the crystallization using the MILC process. Therefore, an MILC surface does not exist in first to fourth channel regions 52-21 through 52-24, but exists between the slots 56S of the gate electrode 56, namely, in the impurity areas 52-12 and 52-14 for the source/drain regions.

An MILC surface which is not in the channel regions exists in the impurity area 52-13 where the crystallization process is preceded in the same method as in the embodiment of FIGS. 1A to 1D.

Subsequently, the source/drain electrodes 62-1 and 62-2 are formed, and a conductive pattern 62-3 contacting the impurity area 52-13 through the third contact hole 59-3 is formed by patterning the metal material 61 for source/drain electrodes and a metal film 60 at the lower part of the metal 61 for source/drain electrodes using a fourth mask (which is not shown in the drawings) after depositing a metal for source/drain electrodes on the metal film 60.

In this embodiment, the metal film 60 for the MILC is not removed but instead is used as the source/drain electrodes 62-1 and 62-2. However, the metal film 60 for the MILC process can also be removed after progressing the MILC process.

Figure 7:
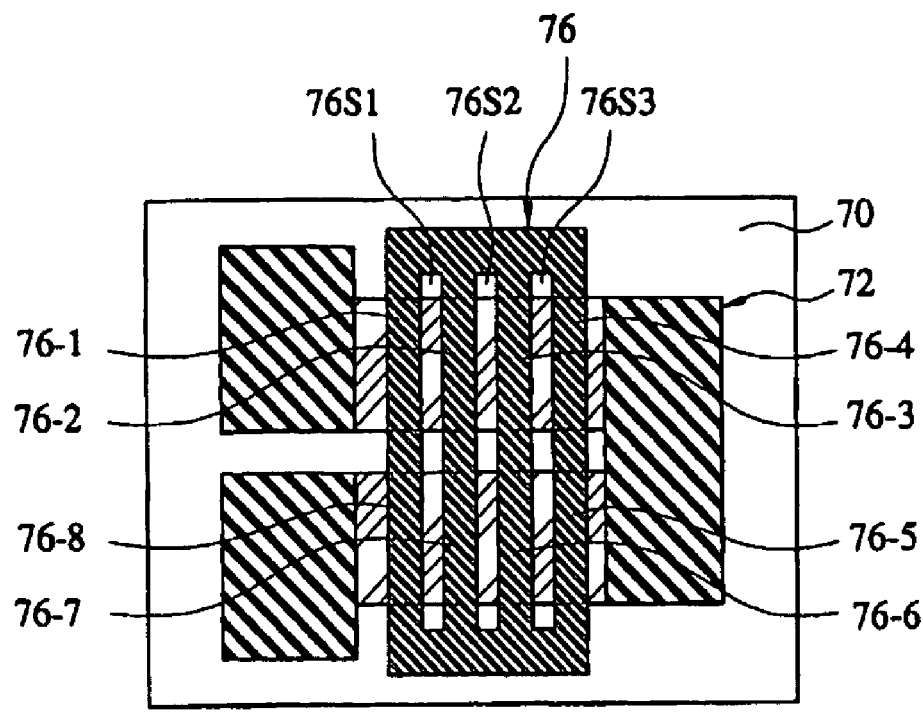
FIG. 7 is a drawing illustrating a structure of the multiple gates in a TFT with multiple gates using the MILC process according to yet another embodiment of the present invention.

FIG. 7 illustrates the plan structure of a thin film transistor with multiple gates according to another embodiment of the present invention.

Referring to FIG. 7, a semiconductor layer 72 has a zigzag shape equipped with a plurality of connection parts 72B to connect a plurality of body parts 72L1 and 72L2 with each neighboring body parts 72L1 and 72L2, and a gate electrode 76 is equipped with a plurality of slots, for example, 76S1 through 76S3 which are formed so as to intersect with the semiconductor layer 72.

A thin film transistor according to this embodiment can be fabricated by the same method as in the previous embodiments, wherein the case that the MILC process is progressed in one direction only as in FIGS. 1A to 1D is not influenced by the number of slots since an MILC surface is formed at the connection part.

However, it is preferable to form slots at the central part of the body in which an MILC surface is to exist since the MILC surface exists in the body part where the MILC process is progressed in both directions as in FIGS. 5A to 5D, and it is particularly preferable that the number of slots is an odd number so that the MILC surface does not exist in channel regions, but rather in a semiconductor layer in the slots. The reason that the MILC surface does not exist in the channel regions, but in the semiconductor layer in the slots positioned at the center is that the number of slots is an odd number while the MILC surface does exist in the channel regions in the semiconductor layer in case that the number of the slots is an even number.

A separate masking process to form a metal film for the MILC process and a process to remove the metal film remaining after the MILC process is excluded so that the processes of forming a TFT with multiple gates are simplified, and an MILC surface does not exist in the channel regions so as to prevent generation of defects and reduce leakage current in methods of fabricating a thin film transistor with multiple gates according to the embodiments of FIGS. 1A to 1D, 5A to 5D, and FIG. 7. Furthermore, the thin film transistors with multiple gates are fabricated by forming the semiconductor layers and the gate electrodes so that zigzag shaped semiconductor layers intersect with gate electrodes, thereby reducing leakage current without increasing the dimensions as, illustrated in FIG. 10.

Furthermore, multiple gates having the number of M (number of body parts of a semiconductor layer)×N (number of slots of a gate electrode+1) are realized by forming the semiconductor layer in a zigzag shape and forming a gate electrode equipped with one or more slots crossing the semiconductor layer in the methods of fabricating a thin film transistor with multiple gates according to the embodiments of FIGS. 1A to 1D, FIGS. 5A to 5D and FIG. 7 of the present invention.

Furthermore, a process time is proportionally increased as dimensions are increased where a thin film transistor with multiple gates is fabricated using a conventional MILC process, while a method of fabricating a thin film transistor with multiple gates as in the embodiment of FIGS. 5A to 5D shortens a process time as much as about 60% and remarkably reduces leakage current due to the multiple gates, compared with a method of fabricating a thin film transistor with multiple gates using a conventional MILC process.

FIG. 10 represents characteristics of leakage current of a thin film transistor according to examples of the present invention, and it can be seen that a multi-gate or 4-fold gate structure, rather than a single gate structure, reduces leakage current, and the multi-gate or 4-fold gate structure of the present invention is capable of reducing leakage current as much as 10 times or more particularly in a region where a drain current (Vd) is 5 V or more compared with the single gate structure.

Figure 8A:
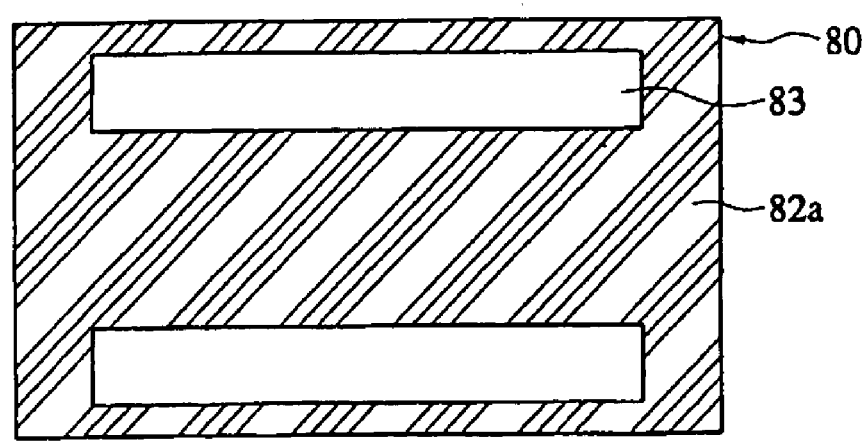
FIG. 8A to FIG. 8C are plan views illustrating a method of fabricating a TFT with multiple gates using an MILC process according to yet another embodiment of the present invention.
Figure 8B:
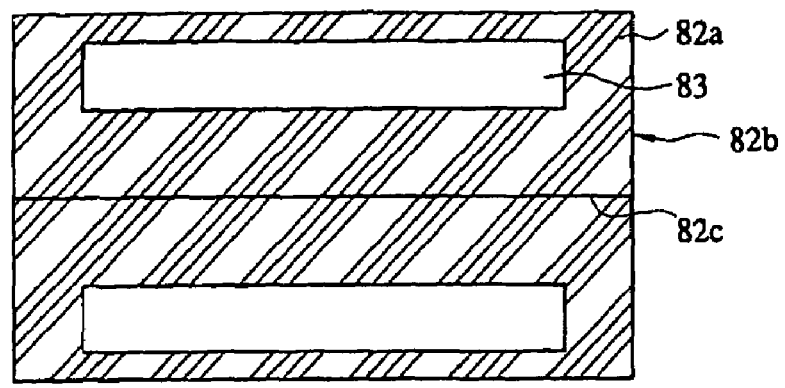
Figure 8C:
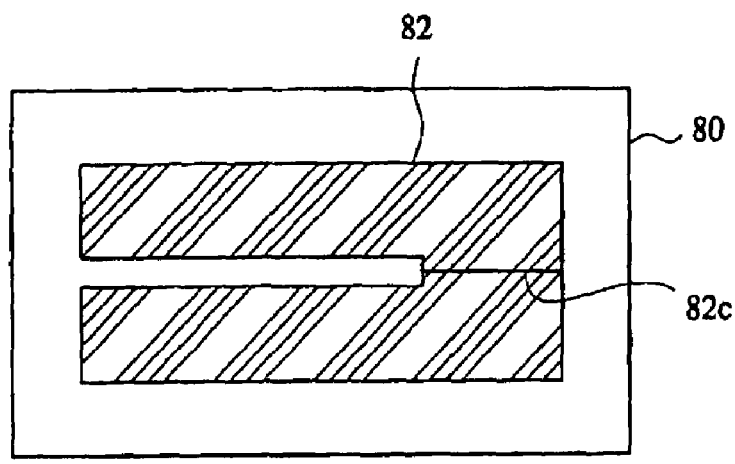

FIG. 8A to FIG. 8C are plan views illustrating a method of fabricating a TFT with multiple gates using the MILC process according to another embodiment of the present invention.

A semiconductor layer is formed by patterning the polycrystalline silicon film after crystallizing an amorphous silicon film into a polycrystalline silicon film using an MILC process in a method of fabricating a thin film transistor with multiple gates according to the embodiment of FIGS. 8A to 8C.

That is, the amorphous silicon film 82a is crystallized into a polycrystalline silicon film 82b by depositing an amorphous silicon film 82a on an insulating substrate 80 comprising a buffer layer (which is not shown in the drawing), forming a metal film 83 for a catalyst layer of the MILC at both edge parts as illustrated in FIG. 8A, and progressing the MILC process as illustrated in FIG. 8B.

Subsequently, a "⊏" shaped semiconductor layer 82 is formed by patterning the polycrystalline silicon film 82b using a mask for the semiconductor layer after removing the metal film 83, as illustrated in FIG. 5C. This embodiment can be applied to a thin film transistor having the same structure as in the embodiment of FIGS. 1A to 1D so that an MILC surface 82c exists outside channel regions. Thereafter, a thin film transistor with multiple gates is fabricated by the same method as in the the embodiment of FIGS. 1A to 1D.

Figure 9A:
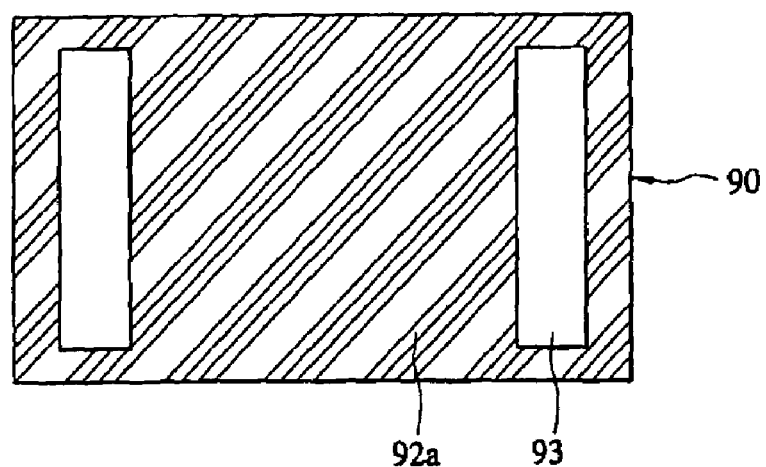
FIG. 9A to FIG. 9C are plan views illustrating a method of fabricating a TFT with multiple gates using an MILC process according to yet another embodiment of the present invention.
Figure 9B:
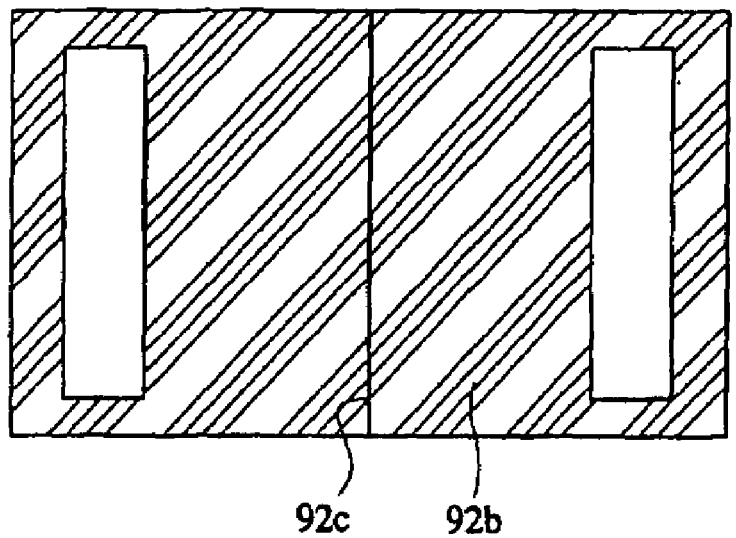
Figure 9C:
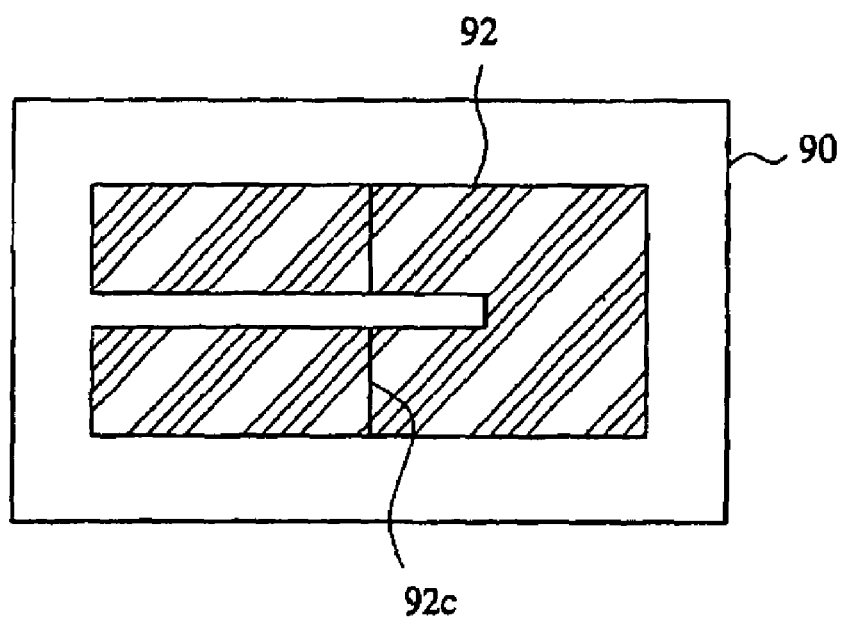

FIG. 9A to FIG. 9C are plan views illustrating a method of fabricating a TFT with multiple gates using an MILC process according to another embodiment of the present invention.

In this embodiment, a semiconductor layer is formed by patterning the polycrystalline silicon film after crystallizing an amorphous silicon film into a polycrystalline silicon film using the MILC process as in the the embodiment of FIGS. 8A to 8C.

That is, the amorphous silicon film 92a is crystallized into a polycrystalline silicon film 92b by depositing an amorphous silicon film 92a on an insulating substrate 90, forming a metal film 93 for a catalyst layer of the MILC at both edge parts, as illustrated in FIG. 9A, and progressing the MILC process, as illustrated in FIG. 9B.

Subsequently, a "⊏" shaped semiconductor layer 92 is formed by patterning the polycrystalline silicon film 92b using a mask for the semiconductor layer after removing the metal film 93, as illustrated in FIG. 9C. This embodiment can be applied to a thin film transistor having the same structure as in the embodiment of FIG. 7 so that an MILC surface 92c exists outside channel regions during formation of multiple gates. Thereafter, a thin film transistor with multiple gates is fabricated in the same method as in the previous embodiment.

As described above, a method of fabricating a thin film transistor with multiple gates using the MILC process has merits in that a separate masking process of forming a metal film for the MILC and a process of removing the metal film after the MILC is removed so as to simplify the processes, and an MILC surface does not exist in channel regions so as to reduce leakage current.

The thin film transistors according to the embodiments of the present invention have merits in that multiple gates having the number of M (number of body parts of a semiconductor layer)×N (number slots of a gate electrode+

1) are realized without increasing dimensions by forming the semiconductor layer in a zigzag shape and forming a gate electrode equipped with one or more slots crossing the semiconductor layer.

Furthermore, the present invention not only reduces leakage current and manufacturing cost but also shortens process time by forming a thin film transistor with multiple gates using the MILC process without an additional masking process.

Furthermore, the present invention enables compact designs since dimensions are not increased by forming a semiconductor layer in a zigzag shape and forming a plurality of slots on gate electrodes so that the slots intersect with the semiconductor layer, thereby forming a thin film transistor with multiple gates. Therefore, the present invention has merits in that leakage current is suppressed, and reliability is improved with an opening ratio not being influenced to a large extent.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor using metal induced lateral crystallization (MILC), comprising:
   multi-semiconductor layers each of which are adjacently formed on an insulating substrate; and
   a gate electrode which is formed so that it intersects with the semiconductor layer, thereby forming different channel regions,
   wherein MILC surfaces do not exist in the channel regions and the MILC surface is a portion where two surfaces of crystallized polysilicon grown to an opposite direction by an MILC process meet.

2. The thin film transistor of claim 1, wherein the semiconductor layer comprises two or more body parts intersecting with the gate electrode; and one or more connection parts to connect each neighboring body parts, and wherein a part intersecting with the gate electrode in the semiconductor layer acts the channel region and a part overlapped with the channel region of the semiconductor layer acts a multiple gate.

3. The thin film transistor of claim 2, further comprising a source/drain electrode which is formed so that it is connected with a portion out of the channel regions in the multi-semiconductor layer.

4. The thin film transistor of claim 2, wherein the MILC surfaces exist in the semiconductor layer.

5. The thin film transistor of claim 4, wherein the MILC surfaces exist in the connection parts.

6. The thin film transistor of claim of claim 1, wherein the gate electrode is equipped with one or more slots intersecting with the semiconductor layer.

7. The thin film transistor of claim 6, wherein the semiconductor layer has MILC surfaces at parts corresponding to the slots of the gate electrode.

8. The thin film transistor of claim 2, wherein the connection parts are different layers from the semiconductor layers.

9. The thin film transistor of claim 8, wherein the connection is one of the same material as the gate electrode and the same material as a source/drain electrode.

10. The thin film transistor of claim 8, wherein the MILC surfaces do not exist in the semiconductor layer.

11. A thin film transistor fabricated using a metal induced lateral crystallization (MILC) process, the thin film transistor comprising:
    a plurality of semiconductor layers formed by the MILC process on an insulating substrate, the semiconductor layers being separated from one another; and
    a gate electrode intersecting with the semiconductor layers, thereby forming a plurality of channel regions;
    wherein no MILC surface exists in any of channel regions, an MILC surface being a surface where two surfaces of crystallized polysilicon grown in opposite directions by the MILC process meet.

12. The thin film transistor of claim 11, wherein the semiconductor layers are body parts;
    wherein the thin film transistor further comprises at least one semiconductor layer that is a connection part connecting two neighboring ones of the body parts to each other, the connection part being formed on the insulating substrate by the MILC process;
    wherein portions of the body parts intersecting with the gate electrode act as channel regions; and
    wherein portions of the gate electrode overlapping the channel regions act as multiple gates.

13. The thin film transistor of claim 12, further comprising a source electrode that contacts a portion of one of the body parts outside any of the channel regions; and
    a drain electrode that contacts a portion of another one of the body parts outside any of the channel regions.

14. The thin film transistor of claim 12, wherein no MILC surface exists in any of the body parts.

15. The thin film transistor of claim 14, wherein an MILC surface exists in the connection part.

16. The thin film transistor of claim 11, wherein the gate electrode comprises one or more slots intersecting with the semiconductor layers.

17. The thin film transistor of claim 16, wherein at least one MILC surface exists in at least one portion of at least one semiconductor layer of the semiconductor layers, each portion of the at least one portion of the at least one semiconductor layer being overlapped by one slot of the one or more slots of the gate electrode.

18. The thin film transistor of claim 11, further comprising at least one link connecting two neighboring ones of the semiconductor layers to each other
    wherein portions of the semiconductor layers intersecting with the gate electrode act as channel regions; and
    wherein portions of the gate electrode overlapping the channel regions act as multiple gates.

19. The thin film transistor of claim 18, wherein the link is in one layer of the thin film transistor, and the semiconductor layers are in another, different layer of the thin film transistor.

20. The thin film transistor of claim 19, further comprising:
    a source electrode that contacts a portion of one of the semiconductor layers outside any of the channel regions; and
    a drain electrode that contacts a portion of another one of the semiconductor layers outside any of the channel regions;
    wherein the link is made of a same material as the gate electrode or a same material as the source electrode and the drain electrode.

21. The thin film transistor of claim 19, wherein no MILC surface exists in any of the semiconductor layers or in the link.

* * * * *